(12) United States Patent
Moriyama

(10) Patent No.: US 7,177,203 B2
(45) Date of Patent: Feb. 13, 2007

(54) DATA READOUT CIRCUIT AND SEMICONDUCTOR DEVICE HAVING THE SAME

(75) Inventor: Katsutoshi Moriyama, Saga (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/100,913

(22) Filed: Apr. 7, 2005

(65) Prior Publication Data
US 2005/0231999 A1    Oct. 20, 2005

(30) Foreign Application Priority Data
Apr. 16, 2004    (JP) .............................. 2004-121723

(51) Int. Cl.
*G11C 5/14*    (2006.01)
(52) U.S. Cl. .................. 365/189.09; 365/149; 365/205
(58) Field of Classification Search ........... 365/189.09, 365/205, 149
See application file for complete search history.

(56) References Cited

U.S. PATENT DOCUMENTS 6,067,253 A * 5/2000 Gotou .................... 365/185.25
6,434,065 B1 * 8/2002 Kobayashi et al. ......... 365/200

* cited by examiner

*Primary Examiner*—Tuan T. Nguyen
(74) *Attorney, Agent, or Firm*—Sonnenschein Nath & Rosenthal LLP

(57) ABSTRACT

A data readout circuit for reading memory data from a resistance change memory disposed at a point where a bit line and a word line intersect by setting a potential of the bit line to a predetermined bias potential and detecting a current value flowing in the resistance change memory, includes a capacitance device connected to the bit line via a switching device; and a current supply circuit connected to both ends of the switching device to provide a current to the bit line such that the potential of the bit line is equal to a potential of the capacitance device.

4 Claims, 7 Drawing Sheets

DATA READOUT CIRCUIT AND SEMICONDUCTOR DEVICE HAVING THE SAME

CROSS REFERENCE TO RELATED APPLICATIONS

The present invention contains subject matter related to Japanese Patent Application JP2004-121723, filed in the Japanese Patent Office on Apr. 16, 2004, the entire contents of which being incorporated herein by reference.

FIELD OF THE INVENTION

The present invention relates to a data readout circuit and a semiconductor device having the circuit.

DESCRIPTION OF RELATED ART

In recent years, as a large-capacity nonvolatile memory, a semiconductor device using a resistance change memory which can be mounted in high density on a semiconductor substrate has attracted attention. The resistance change memory is, as represented by an MRAM (Magnetic Random Access Memory), configured so that the internal resistance value thereof is increased or decreased in accordance with the memory data ("0" or "1").

The semiconductor device using the resistance change memory has a structure in which the resistance change memory is disposed at a point where a bit line and a word line intersect, a data readout circuit is connected to the resistance change memory, and data stored in the resistance change memory is read by using the data readout circuit by detecting a current value flowing in the resistance change memory when a potential of the bit line is set to a predetermined bias potential.

As shown in FIG. 7, in a related art data readout circuit 101 incorporated in a semiconductor device, in order to set a potential of a bit line 102 to a predetermined bias potential, it is configured such that a current conveyer circuit 104 is connected to the resistance change memory 103 in parallel, and the potential of the bit line 102 is made to increase to the predetermined bias potential at the time of reading data by using the current conveyer circuit 104, whereby the bias potential is applied to the resistance change memory 103 (for example, referred to Patent Document: U.S. Pat. No. 6,205,073). In the figure, a numeral number 105 indicates a decoder and a numeral number 106 indicates a current source.

SUMMARY OF THE INVENTION

In the related art data readout circuit 101 using the current conveyer circuit 104, however, because the potential of the bit line 102 is made to increase from the initial value (typically, 0V) to a predetermined bias potential (for example, 0.4V) at the time of reading data, it takes time about several μs until the potential of the bit line 102 becomes stable at the bias potential.

For that reason, the semiconductor device using the related art data readout circuit 101 has a difficulty of reading data sequentially at high speed.

In a first aspect of the present invention, there is provided a data readout circuit which is configured to read memory data from a resistance change memory disposed at a point where a bit line and a word line intersect by setting a potential of the bit line to a predetermined bias potential and detecting a current value flowing in the resistance change memory, the data readout circuit including: a capacitance device connected to the bit line via a switching device; and a current supply circuit connected to both ends of the switching device to provide a current to the bit line such that the potential of the bit line is equal to a potential of the capacitance device; wherein after a predetermined amount of electric charge is accumulated in the capacitance device while the switching device is in a disconnected state, the switching device is made to a connected state and the electric charge accumulated in the capacitance device is distributed between a capacitance of the capacitance device and a capacitance of the bit line so as to set the potential of the capacitance device to the bias potential; and after the switching device is made to a disconnected state and the potential of the bit line is increased to a predetermined potential in advance, memory data is read from the resistance change memory by increasing the potential of the bit line to the bias potential using the current supply circuit.

According to a second aspect of the present invention, in the data readout circuit of the first aspect, a sense amplifier is connected to the current supply circuit, the sense amplifier is configured to amplify a readout current supplied from the current supply circuit to the resistance change memory and a reference current serving as a threshold at the time of determinating a memory state in the resistance change memory, and to output a current difference between the amplified readout current and the amplified reference current.

In a third aspect of the present invention, there is provided a semiconductor device having a resistance change memory as a memory cell disposed at a point where a bit line and a word line intersect and a data readout circuit connected to the resistance change memory, the data readout circuit reads memory data by detecting a current value flowing in the resistance change memory when a potential of the bit line is set to a predetermined bias potential; wherein the data readout circuit including: a capacitance device connected to the bit line via a switching device; and a current supply circuit connected to both ends of the switching device to provide a current to the bit line such that the potential of the bit line is equal to a potential of the capacitance device; wherein after a predetermined amount of electric charge is accumulated in the capacitance device while the switching device is in a disconnected state, the switching device is made to a connected state and the electric charge accumulated in the capacitance device is distributed between a capacitance of the capacitance device and a capacitance of the bit line so as to set the potential of the capacitance device to the bias potential; and after the switching device is made to a disconnected state and the potential of the bit line is increased to a predetermined potential in advance, memory data is read from the resistance change memory by increasing the potential of the bit line to the bias potential using the current supply circuit.

According to a forth aspect of the present invention, in the semiconductor device of the third aspect, a sense amplifier is connected to the current supply circuit; and the sense amplifier is configured to amplify a readout current supplied from the current supply circuit to the resistance change memory and a reference current serving as a threshold at the time of determinating a memory state in the resistance change memory, and to output a current difference between the amplified readout current and the amplified reference current.

In an embodiment of the present invention, when reading the memory data, after the potential of the bit line is made to increase to the predetermined potential in advance, the increased potential is made to further increase to the predetermined bias potential, so that the potential of the bit line can be stabilized at the bias potential in a short period, whereby the memory data can be read from the resistance change memory in a short period and a reading operation at higher speed can be achieved.

Specifically, because the potential of the bit line is made to increase to the predetermined potential in advance by distributing electric charge accumulated in the capacitance device connected to the bit line between the capacitance of the capacitance device and the capacitance of the bit line, so that the time required for pre-charging the bit line can be shortened.

In addition, after amplifying the readout current which is varied in accordance with the memory state in the resistance change memory and the reference current which serves as the threshold when the memory state of the resistance change memory is determined, respectively, a current difference between them is output. Therefore, the current difference (margin) between the readout current and the reference current can be increased, whereby the memory state of the reference current can be determined accurately.

DESCRIPTION OF THE EMBODIMENT(S)

Figure 1:
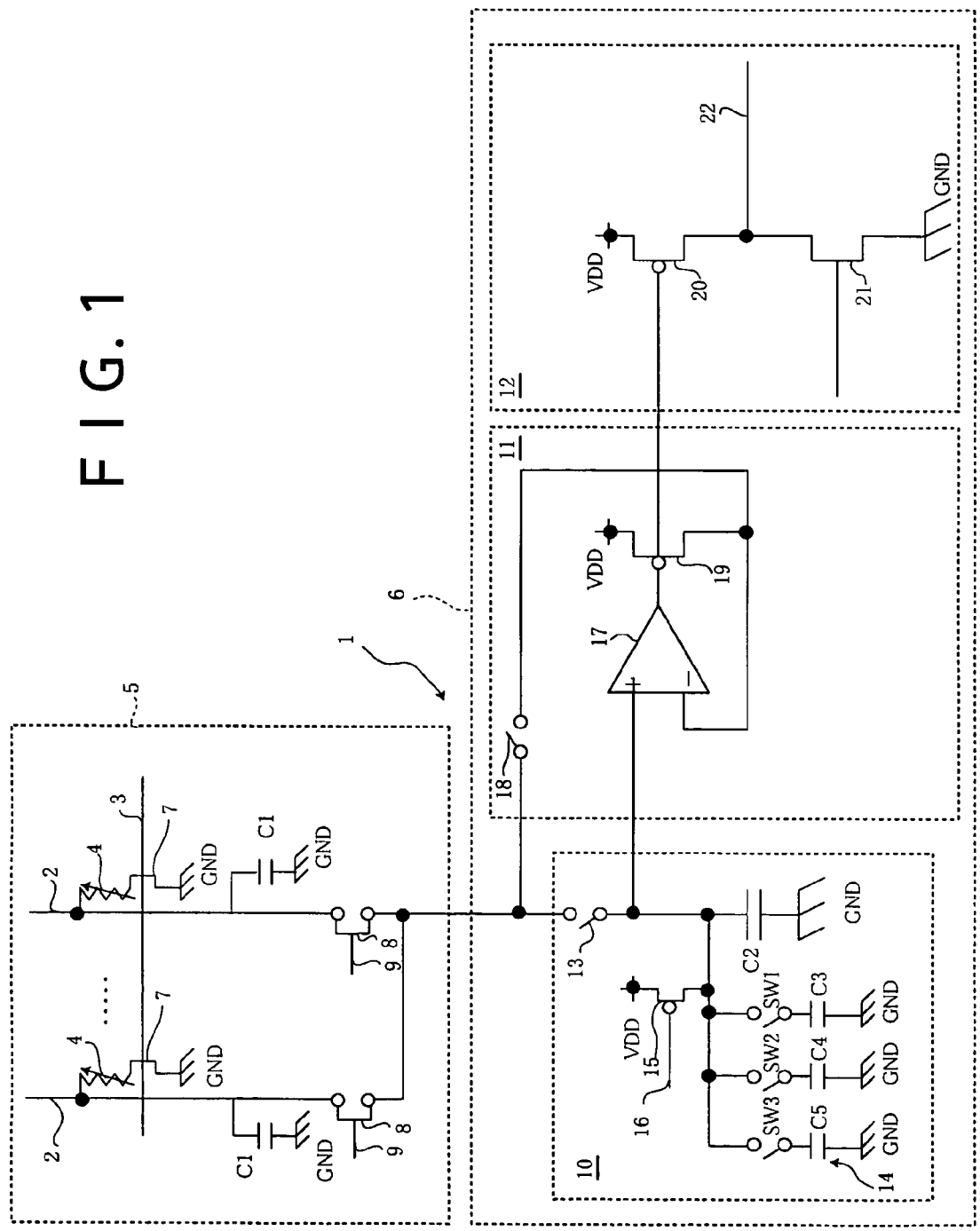
FIG. 1 is a circuit diagram showing a semiconductor device according to an embodiment of the present invention.

The present invention relates to a semiconductor device, such as a semiconductor memory chip using, as a memory cell, a resistance change memory whose internal resistance value is varied in accordance with memory data, and a semiconductor chip incorporating the memory cell and a processor.

In addition, the semiconductor device according to an embodiment of the present invention has, as a memory cell, a resistance change memory disposed at a point where a bit line and a word line intersect, which are connected to respective decoders, and a data readout circuit connected to the resistance change memory.

In the data readout circuit, a constant read voltage is applied to the resistance change memory by setting a potential of the bit line to a predetermined bias potential, at this time, a current value of the readout current flowing in the resistance change memory is detected and compared with a predetermined reference current, whereby the memory data is read from the resistance change memory.

In addition, in the data readout circuit according to an embodiment of the present invention, a capacitance device is connected to the bit line via a switching device, and a current supply circuit for supplying current to the bit line is connected to both ends of the switching device so that the potential of the bit line becomes equal to the potential of the capacitance device, and further, a sense amplifier is also connected to the current supply circuit.

In the data readout circuit, the memory data is read from the resistance change memory as follows.

First, a predetermined amount of electric charge is accumulated in the capacitance device while the switching device is in the disconnected state.

Next, the accumulated electric charge is distributed between a capacitance of the capacitance device and a capacitance of the bit line by making the switching device to the connected state. As a result, the potential of the capacitance device is set to the bias potential and the potential of the bit line is increased to a predetermined potential in advance.

Next, the switching device is made to the disconnected state and the potential of the bit line is increased to the bias potential by using the current supply circuit.

Finally, a readout current supplied from the current supply circuit to the resistance change memory and a reference current serving as the threshold when a memory state of the resistance change memory is determined are amplified by using the sense amplifier, and a current difference between them is output. By determining a resistance state of the resistance change memory from the current difference, the memory data is read from the resistance change memory.

As described above, in the semiconductor device according to an embodiment of the present invention, when reading the memory data, after the potential of the bit line is increased to the predetermined potential, the increased potential is further increased to the predetermined bias potential, so that the potential of the bit line can be stabilized at the bias potential in a short period. Accordingly, the memory data can be read in a short period and the reading operation at higher speed can be achieved.

Specifically, the potential of the bit line is increased to the predetermined potential in advance by distributing the electric charge accumulated in the capacitance device connected to the bit line between the capacitance of the capacitance device and the capacitance of the bit line, thereby making possible to reduce the time required for pre-charging the bit line.

The capacitance of the bit line may be the capacitance of the capacitance device separately connected to the bit line or a wiring capacitance of the bit line may be utilized. In the case where the wiring capacitance of the bit line is used, since the capacitance device is not necessary to individually connect to the bit line, the number of component is preventing from increasing, thereby preventing the production cost from increasing.

In addition, after the readout current which varies in accordance with the memory state in the resistance change memory and the reference current which serves as the threshold when the memory state in the resistance change memory is determined are amplified respectively, the current difference between them is output. Therefore, the difference (margin) between the readout current and the reference current can be increased and the memory state in the resistance change memory can be determined accurately.

In the following, a specific configuration of a semiconductor device according to an embodiment of the present invention is described referring to the drawings.

As shown in FIG. 1, a semiconductor device 1 has a memory circuit 5 which is configured to have resistance change memories (MRAM 4) disposed at points where a word line 3 and a plurality of bit lines intersect, and a data readout circuit 6 for reading memory data stored in each MRAMs 4 is connected to the memory circuit 5.

In the memory circuit 5, the MRAMs 4 are connected to each of the bit lines 2, switching transistors 7 are connected between the MRAMs 4 and ground terminals GND, and the word line 3 is connected to each gate terminal of the switching transistors 7. A decoder (not shown) is connected to the word line 3.

In addition, in the memory circuit 5, switching transistors 8 are connected to each of the bit lines 2, control signal lines 9 are connected to each gate terminal of the switching transistors 8. A decoder (not shown) is connected to each of the control signal lines 9.

Moreover, in the memory circuit 5, capacitors C1 are connected as a capacitance device between each of the bit lines 2 and the ground terminals GND. The capacitors C1 can use a wiring capacitance between the bit line 2 and the ground terminal GND.

The data readout circuit 6 is configured to have a bias potential setting circuit 10, a current supply circuit 11 and a sense amplifier 12.

In the bias potential setting circuit 10, a switch 13 is connected to the bit line 2, capacitance devices 14 are connected to the switch 13, ground terminals GND are connected to the capacitance device 14, a switching transistor 15 is connected between a power supply terminal VDD and the capacitance devices 14, a charge signal line 16 is connected to a gate terminal of the switching transistor 15. It is noted that any device may be used as the switch 13 if it functions as a switching device, or a switching transistor may be used.

The capacitance device 14 includes a first capacitor C2 having a comparatively large capacitance and a second capacitor C3 to a forth capacitor C5 respectively having a comparatively small capacitance, which are connected to the first capacitor C2 in parallel via the switches SW1 to SW3, respectively. The whole capacitance of the capacitance device 14 can be finely adjusted by continuous operation of the switches SW1 to SW3.

In the bias potential setting circuit 10, the power supply terminal VDD is connected to the capacitance device 14 by making the charge signal line 16 to the active state, so that a predetermined amount of electric charge is accumulated in the capacitance device 14.

In the current supply circuit 11, a non-inverting input terminal of an operational amplifier 17 is connected to the capacitance device 14 of the bias potential setting circuit 10, an inverting input terminal of the operational amplifier 17 is connected to the bit line 2 via a switch 18, an output terminal of the operational amplifier 17 is connected to a gate terminal of a P channel-type transistor 19, a drain terminal of the transistor 19 is connected to a power supply terminal VDD, and a source terminal of the transistor 19 is connected to the bit line 2 (the inverting input terminal of the operational amplifier 17). It is noted that, any device may be used as the switch 18 if it functions as a switching device, or a switching transistor may be used.

The current supply circuit 11 supplies current to the bit line 2 so that the potential of the capacitance device 14 connected to the non-inverting input terminal becomes equal to the potential of the bit line 2 connected to the inverting input terminal, by making the switch 18 to the connected state.

In the sense amplifier 12, an output terminal of the operation amplifier 17 of the current supply circuit 11 is connected to a gate terminal of a P-channel type transistor 20, a drain terminal of the transistor 20 is connected to a power supply terminal VDD, and a drain terminal of an N-channel type transistor 21 is connected to a source terminal of the transistor 20. A reference current serving as the threshold when the memory state in the MRAMs 4 is determined is flowed to a gate terminal of the transistor 21, and a ground terminal GND is connected to a source terminal of the transistor 21.

The sense amplifier 12 amplifies a readout current supplied from the current supply circuit 11 to the MRAM 4 by the transistor 20 and the reference current serving as the threshold when the memory state in the MRAMs 4 is determined by the transistor 21, and outputs the current difference between them from an output signal line 22.

Next, the operation of the data readout circuit 6 will be described below.

Figure 2:
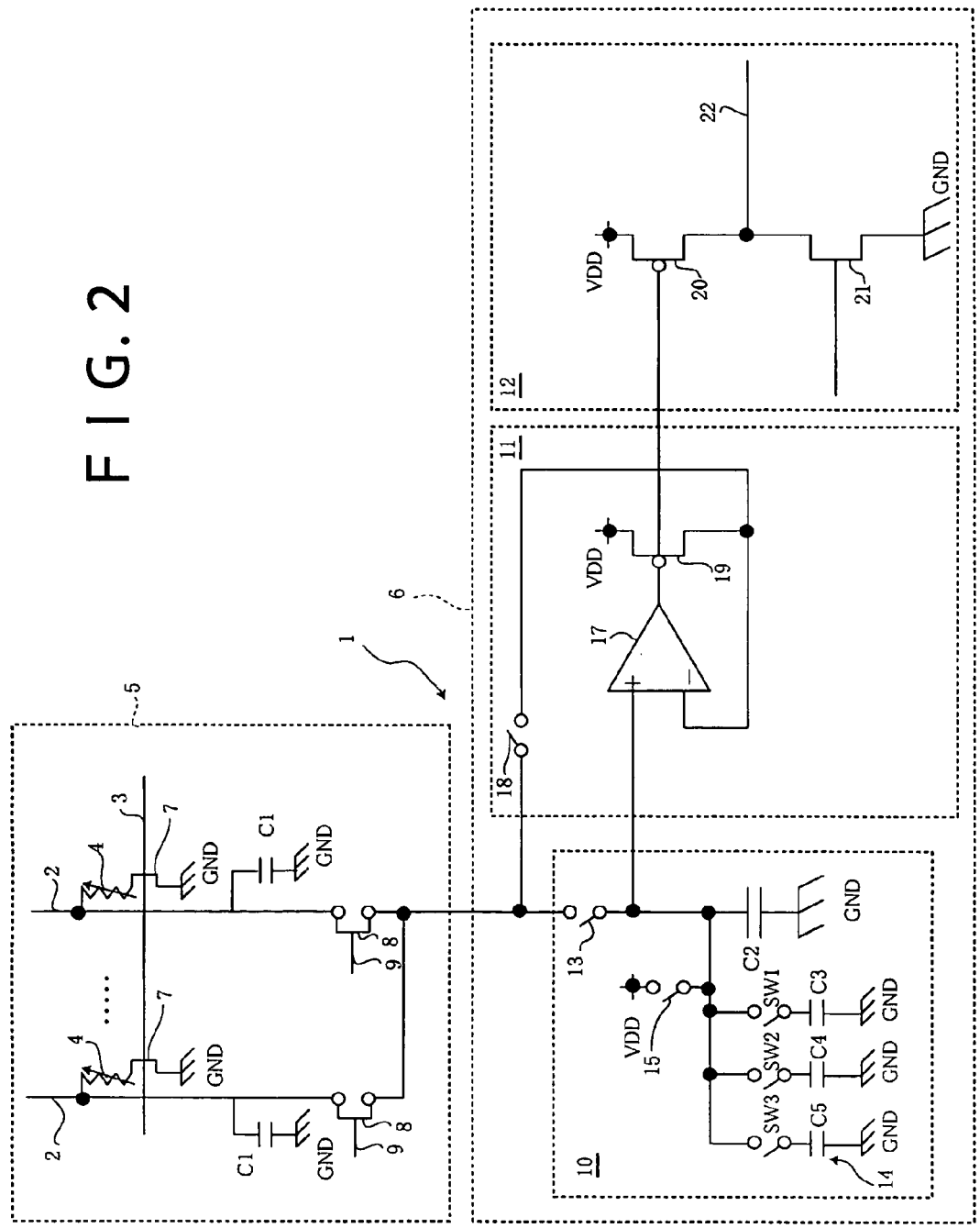
FIG. 2 is a diagram explaining an operation of a data readout circuit according to an embodiment of the present invention.

As shown in FIG. 2, in the data readout circuit 6 at the initial state, the switch 13 and the switch 18 are in the disconnected state and the switching transistor 15 is in the non-active state, so that the electric charge is not accumulated in the capacitance device 14 and the potential of the capacitance device 14 and the potential of the bit line 2 are 0V.

Figure 3:
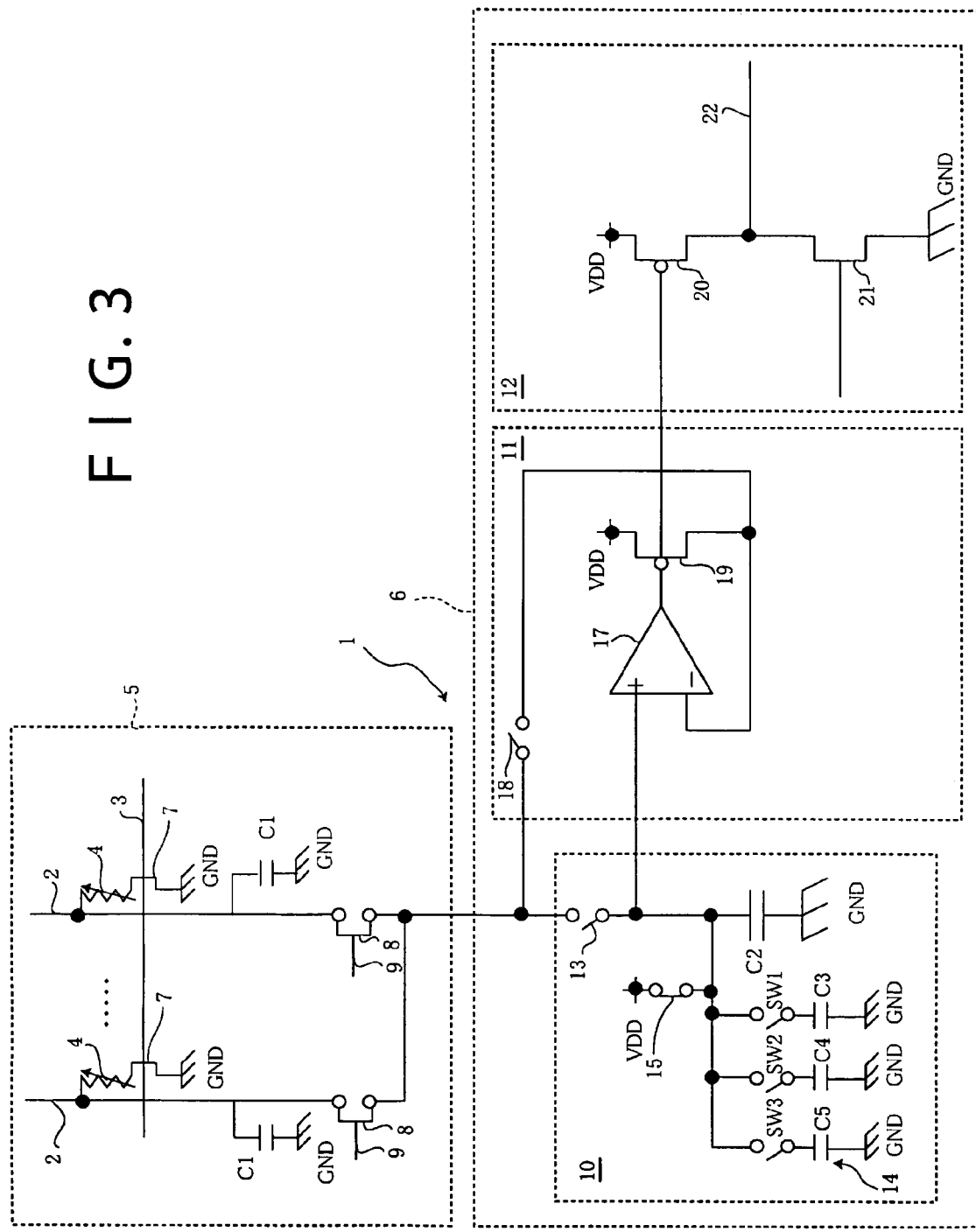
FIG. 3 is a diagram explaining an operation of a data readout circuit according to the embodiment of the present invention.
Figure 6:
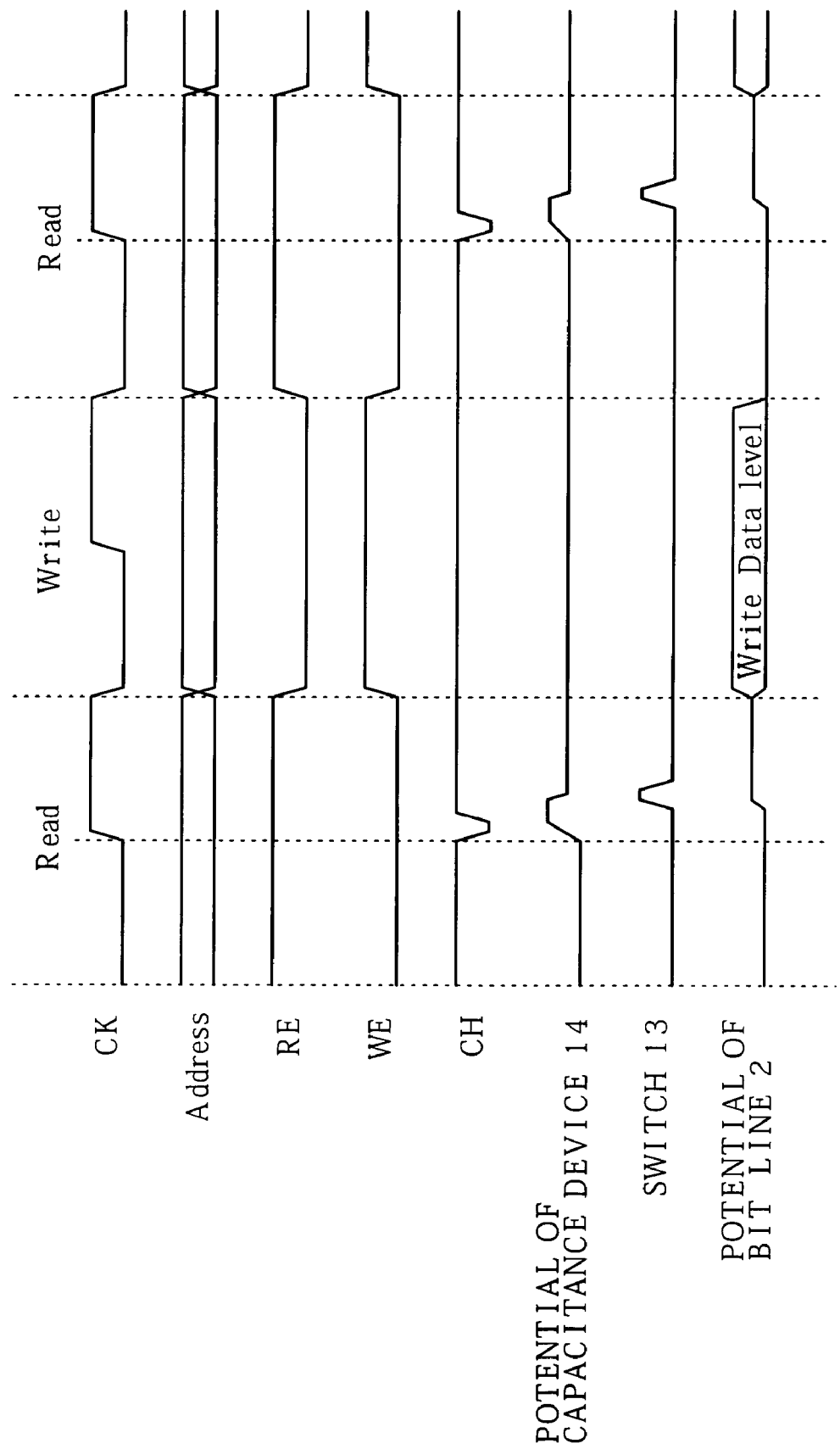
FIG. 6 is a timing chart explaining a operation timing of a data readout circuit according to an embodiment of the present invention.
Figure 7:
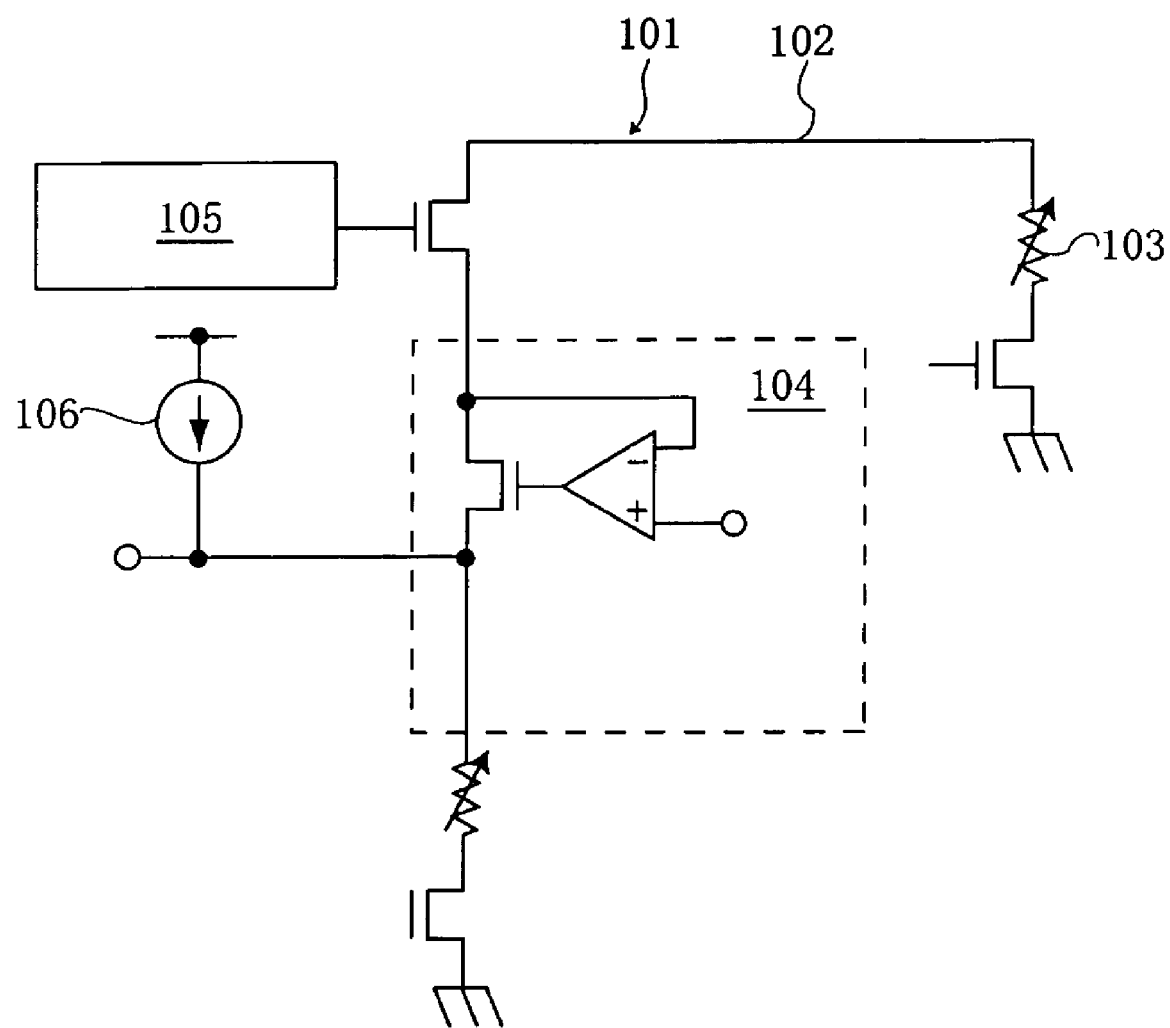
FIG. 7 is a circuit diagram showing a related art data readout circuit.

As shown in FIG. 3 and FIG. 6, when a read enable signal RE becomes the active state and a clock signal CK starts to rise, in response to this, a charge signal CH of the charge signal line 16 becomes the active state, and then the switching transistor 15 also becomes the active state, whereby a predetermined amount of electric charge from the power supply terminal VDD is accumulated in the capacitance device 14.

Figure 4:
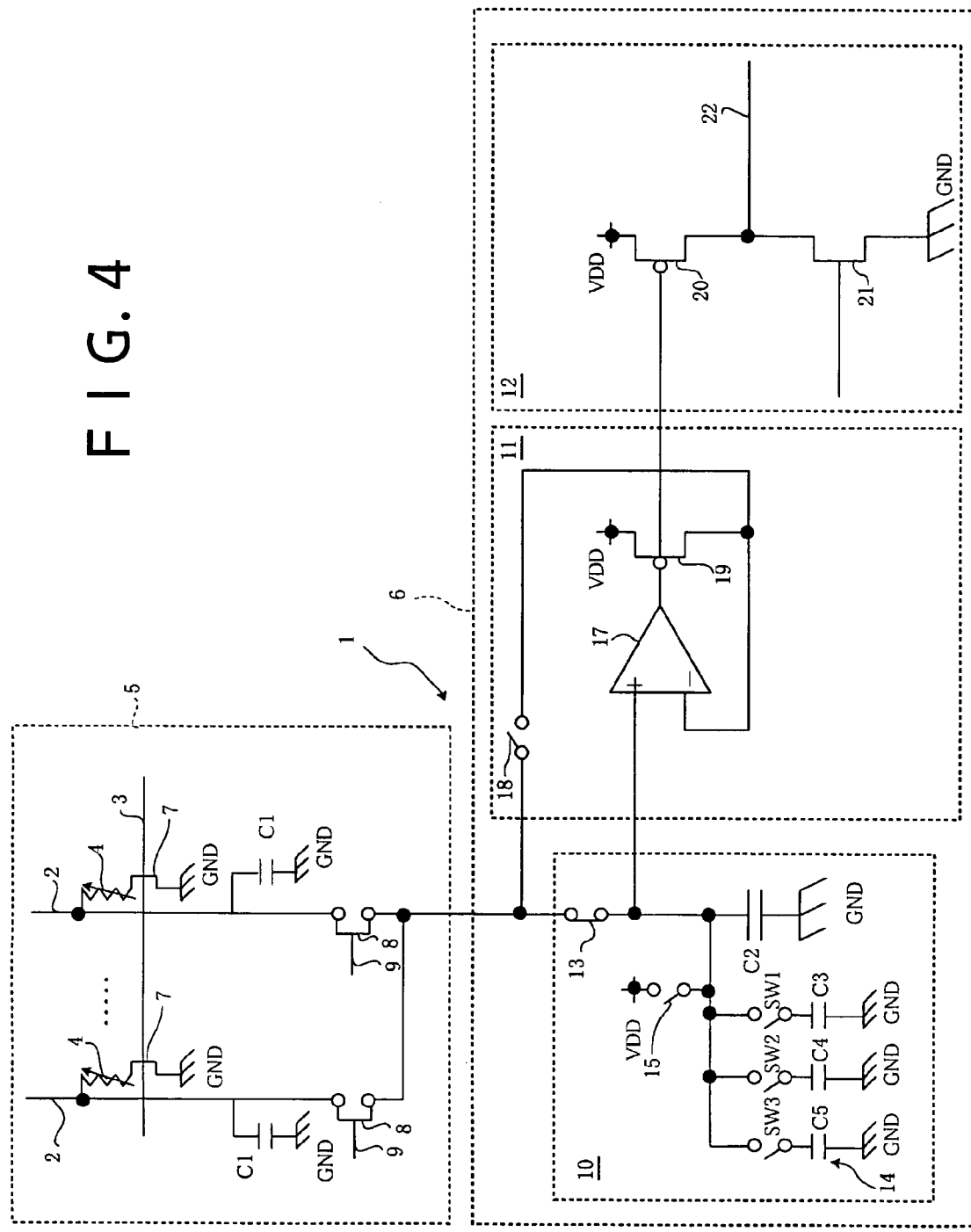
FIG. 4 is a diagram explaining an operation of a data readout circuit according to the embodiment of the present invention.

As shown in FIG. 4 and FIG. 6, when the switching transistor 15 is made to the non-active state and the switch 13 is changed to the connected state, the capacitance device 14 and the capacitor C1 connected to the bit line 2 which is selected by the control signal line 9 are connected in parallel, so that the electric charge accumulated in the capacitance device 14 is distributed between the capacitance of the capacitance device 14 and the capacitance of the bit line 2. Therefore, the potential of the capacitance device 14 becomes a predetermined bias potential, on the other hand, the potential of the bit line 2 increases to a predetermined potential in advance.

For example, if it is assumed that a bias voltage is 0.1V, the capacitance of the capacitor C1 of the bit line 2 is 200 fF and the power source voltage is 1.8V, the capacitance of the capacitance device 14 is calculated as follows:

$$200\text{fF} \cdot 0.1\text{V}/(1.8\text{V}-0.1\text{V}) = 11.76 \text{ fF}.$$

If the capacitance of the capacitance device 14 is set in this manner, the potential of the capacitance device 14 after dividing the capacitance will be the bias potential, and the potential of the bit line 2 can be pre-charged to an approximately bias potential.

The time required for pre-charging would be about several pico seconds because the wiring resistance of the bit line 2 is several tens Ω and the wiring capacitance is several hundreds fF. Therefore the operation would be faster than the operation of the related art by several thousand times.

Figure 5:
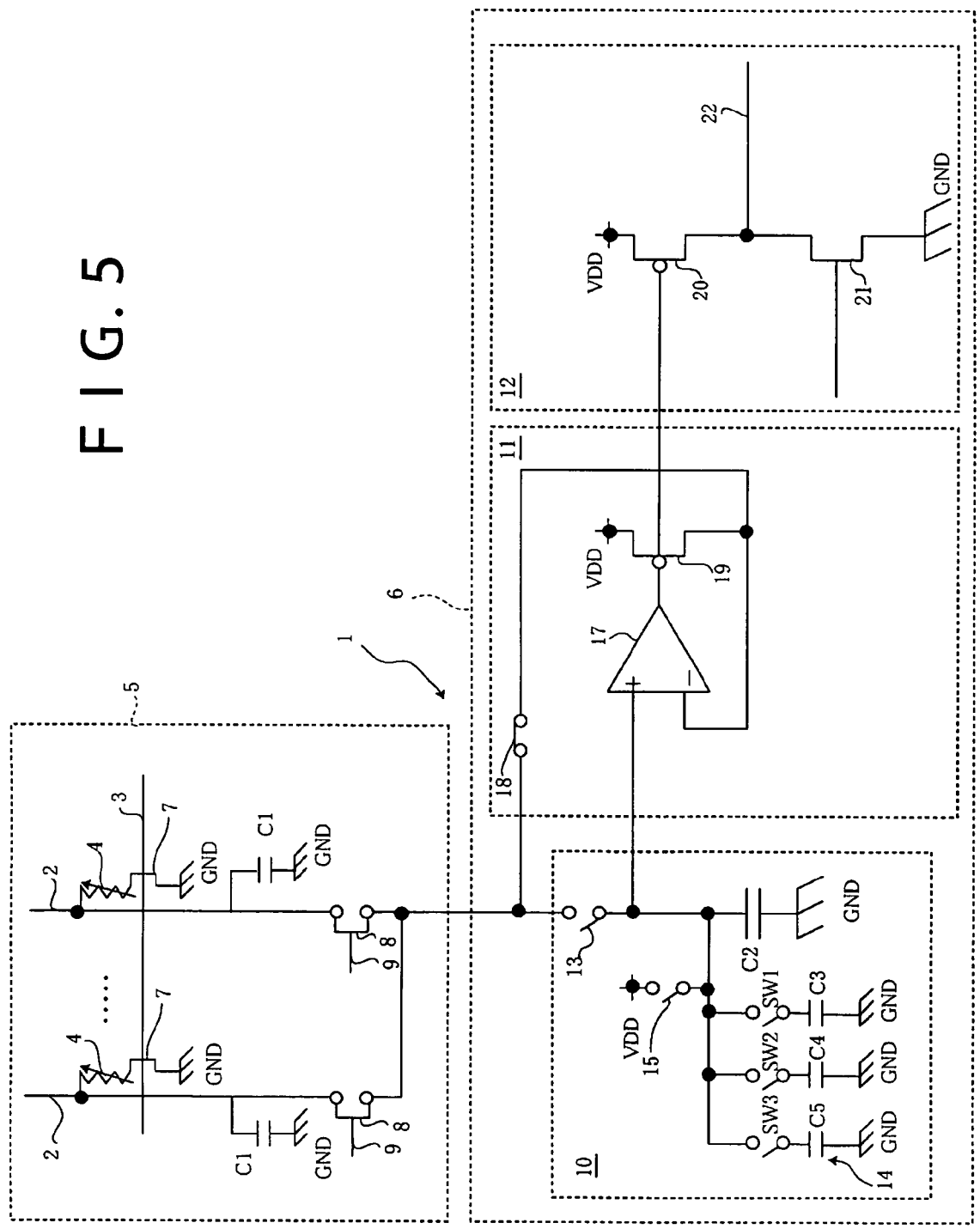
FIG. 5 is a diagram explaining an operation of a data readout circuit according to the embodiment of the present invention.

As shown in FIG. 5 and FIG. 6, when the switch 13 is made to the disconnected state and the switch 18 is changed to the connected state, the current supply circuit 11 operates to increase the potential of the bit line 2 to the bias potential which is determined by the capacitance device 14, and holds the bias potential.

In the sense amplifier 12, the readout current supplied from the current supply circuit 11 to the MRAMs 4 is amplified by n-times by the transistor 20, the reference current serving as the threshold when the memory state in the MRAM is determined is amplified by n-times by the transistor 21, and the current difference between them is output from the output signal line 22.

It should be understood by those skilled in the art that various modifications, combinations, sub-combinations and alterations may occur depending on design requirements and other factors insofar as they are within the scope of the appended claims or the equivalents thereof.

What is claimed is:

1. A data readout circuit which is configured to read memory data from a resistance change memory disposed at a point where a bit line and a word line intersect by setting a potential of the bit line to a predetermined bias potential and detecting a current value flowing in the resistance change memory, the data readout circuit comprising:
    a capacitance device connected to the bit line via a switching device; and
    a current supply circuit connected to both ends of the switching device to provide a current to the bit line such that the potential of the bit line is equal to a potential of the capacitance device,
    wherein,
    after a predetermined amount of electric charge is accumulated in the capacitance device while the switching device is in a disconnected state, the switching device is placed in a connected state and the electric charge accumulated in the capacitance device is distributed between a capacitance of the capacitance device and a capacitance of the bit line so as to set the potential of the capacitance device to the bias potential, and
    after the switching device is made to a disconnected state and the potential of the bit line is increased to a predetermined potential in advance, memory data is read from the resistance change memory by increasing the potential of the bit line to the bias potential using the current supply circuit.

2. The data readout circuit according to claim 1, wherein
    a sense amplifier is connected to the current supply circuit; and
    the sense amplifier is configured (a) to amplify a readout current supplied from the current supply circuit to the resistance change memory and a reference current serving as a threshold at the time of determining a memory state in the resistance change memory, and (b) to output a current difference between the amplified readout current and the amplified reference current.

3. A semiconductor device having a resistance change memory as a memory cell disposed at a point where a bit line and a word line intersect and a data readout circuit connected to the resistance change memory, the data readout circuit reads memory data by detecting a current value flowing in the resistance change memory when a potential of the bit line is set to a predetermined bias potential the data readout circuit comprising:
    a capacitance device connected to the bit line via a switching device; and
    a current supply circuit connected to both ends of the switching device to provide a current to the bit line such that the potential of the bit line is equal to a potential of the capacitance device,
    wherein,
    after a predetermined amount of electric charge is accumulated in the capacitance device while the switching device is in a disconnected state, the switching device is placed in a connected state and the electric charge accumulated in the capacitance device is distributed between a capacitance of the capacitance device and a capacitance of the bit line so as to set the potential of the capacitance device to the bias potential, and
    after the switching device is placed in the disconnected state and the potential of the bit line is increased to a predetermined potential, memory data is read from the resistance change memory by increasing the potential of the bit line to the bias potential using the current supply circuit.

4. The semiconductor device according to claim 3, wherein
    a sense amplifier is connected to the current supply circuit; and
    the sense amplifier is configured (a) to amplify a readout current supplied from the current supply circuit to the resistance change memory and a reference current serving as a threshold at the time of determining a memory state in the resistance change memory, and (b) to output a current difference between the amplified readout current and the amplified reference current.

* * * * *